United States Patent [19]

Ishibashi et al.

[11] Patent Number: 4,797,717

[45] Date of Patent: Jan. 10, 1989

[54] SEMICONDUCTOR MEMORY DEVICE

[75] Inventors: Koichiro Ishibashi; Osamu Minato; Toshiaki Masuhara, all of Tokyo; Yoshio Sakai, Kanagawa; Toshiaki Yamanaka, Houya; Naotaka Hashimoto, Hachioji; Shoji Hanamura, Kokubunji; Nobuyuki Moriwaki, Kodaira; Shigeru Honjyo; Kiyotsugu Ueda, both of Hachioji, all of Japan

[73] Assignee: Hitachi, Ltd., Tokyo, Japan

[21] Appl. No.: 39,291

[22] Filed: Apr. 17, 1987

[30] Foreign Application Priority Data

Apr. 18, 1986 [JP] Japan .................................. 61-88283

[51] Int. Cl.⁴ ..................... H01L 29/78; H01L 27/02; H01L 29/04
[52] U.S. Cl. .................................... 357/23.1; 357/41; 357/45; 357/51; 357/59; 365/154
[58] Field of Search .................... 357/41, 71 P, 51, 45, 357/23.1, 59 E, 89 F, 59 G, 59 J, 59 K, 59 R; 365/154

[56] References Cited

U.S. PATENT DOCUMENTS

| | | |
|---|---|---|
| 4,209,716 | 6/1980 | Raymond, Jr. .................. 357/71 P |
| 4,453,175 | 6/1984 | Ariizumi et al. ..................... 357/41 |
| 4,524,377 | 6/1985 | Eguchi ............................. 357/71 P |
| 4,535,426 | 8/1985 | Ariizumi ............................... 357/41 |
| 4,590,508 | 5/1986 | Hirakawa et al. .................... 357/41 |
| 4,609,835 | 9/1986 | Sakai et al. ........................... 357/41 |

FOREIGN PATENT DOCUMENTS 0087979  9/1983  European Pat. Off. .......... 357/71 P Primary Examiner—J. Carroll
Assistant Examiner—Ngan Van Ngo
Attorney, Agent, or Firm—Antonelli, Terry & Wands

[57] ABSTRACT

Each of the memory cells in a SRAM includes two driver MOS transistors, two transfer gate MOS transistors and two load resistances. The gate electrode layers of the MOS transistors are formed from a first-level conductive layer provided on the surface of a semiconductor substrate. The source regions of the two driver MOS transistors in each memory cell are connected in common and further connected to a ground potential point through a second-level conductive layer. The two load resistances in each memory cell are formed from a third-level high-resistance material layer. The second-level conductive layer is formed from a low-resistance material layer. Thus the resistance of the sources of the two driver MOS transistors is lowered.

7 Claims, 8 Drawing Sheets

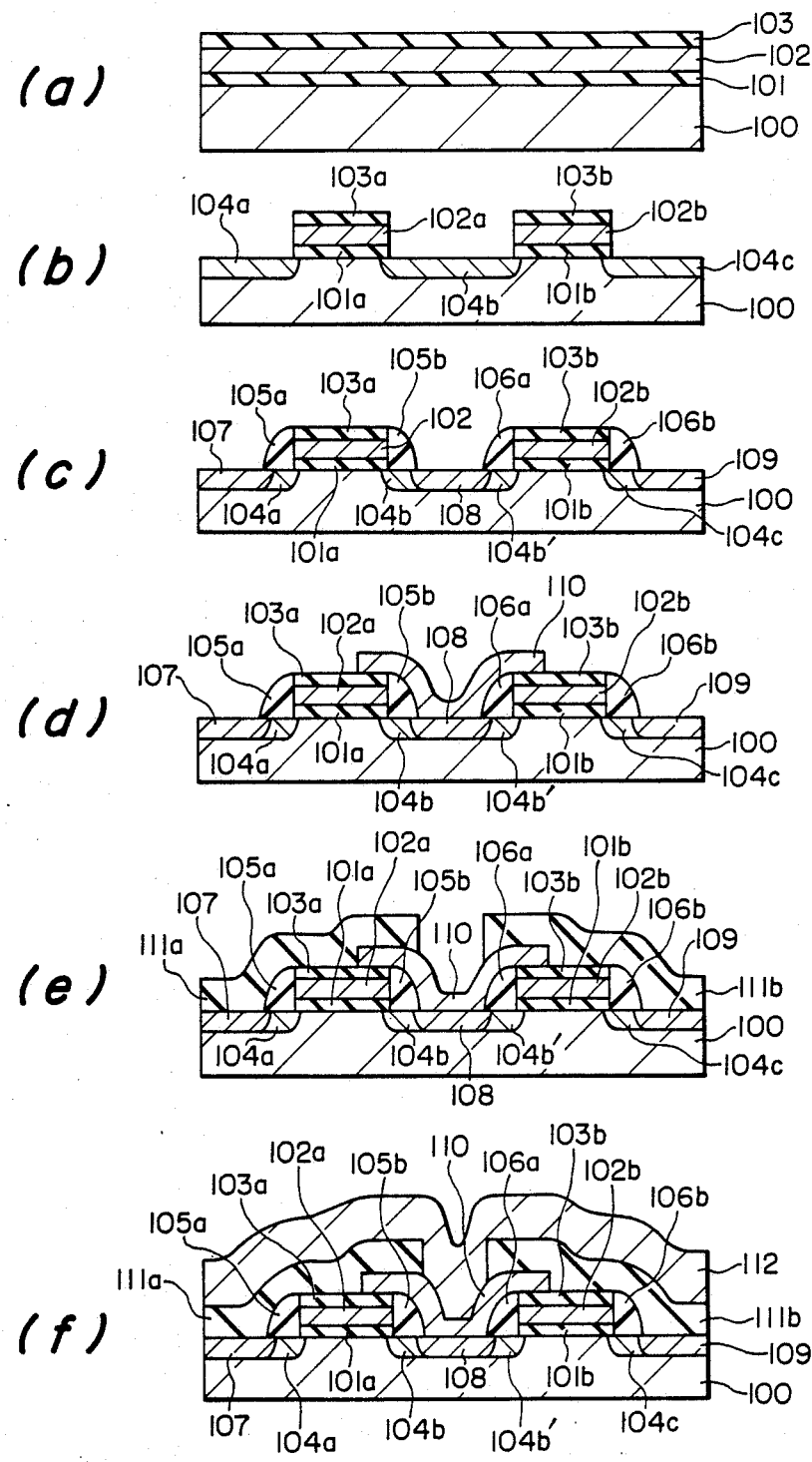

SEMICONDUCTOR MEMORY DEVICE

BACKGROUND OF THE INVENTION

1. Field of the Invention

The present invention relates to a semiconductor memory device and, more particularly, to a semiconductor memory device which comprises a multiplicity of memory cells formed on the same semiconductor substrate, each memory cell having two transfer gate MOS transistors and two driver MOS transistors as its basic constituent elements, and which is so designed that the area required for each memory cell is reduced.

2. Description of the Prior Art

As memory cells for static type random-access memories (hereinafter abbreviated as "SRAM's" arranged using MOS transistors (hereinafter abbreviated as "MOST's"), one type of memory cell consisting of two transfer gate MOST's, two driver MOST's and two load resistances has heretofore been known (see the specification of Japanese Patent Laid-Open No. 117181/1982). FIG. 8 is a circuit diagram of this type of conventional SRAM memory cell. In the figure, the reference numerals 1 to 4 denote n-channel MOST's, the MOST's 1 and 2 serving as transfer gate MOST's, and the MOST's 3 and 4 serving as driver MOST's. The numerals 5 and 6 denote source nodes of the driver MOST's 3 and 4, respectively, which are fixed to a fixed potential (e.g., a ground potential). The numerals 10 and 11 denote data lines, 9 a word line, and 7, 8 load resistances for supplying currents which respectively hold bits of data stored at nodes 81, 82 by supplying currents from a power supply potential point Vcc. The load resistances 7 and 8 are generally formed from high-resistance polycrystalline silicon layers. Data is written down into or read out from this memory cell through the data lines 10 and 11 by raising the potential of the word line 9 from a low level to a high level. A multiplicity of memory cells of the type described above are formed on the same semiconductor substrate to constitute a SRAM.

FIG. 9 shows the layout of a SRAM memory cell which has been developed by the present inventors prior to this application. No high-resistance polycrystalline silicon layer is illustrated in this figure. One memory cell and parts of cells which are adjacent thereto are included in the illustrated layout. The reference numerals 18A and 19A denote gate electrode layers for the driver MOST's 3 and 4, 12 a gate electrode layer for the transfer gate MOST's 1 and 2, and 13 to 16 impurity introduced regions which define data lines, respectively. The numeral 26 denotes an impurity introduced region which defines respective source regions of the driver MOST's 3 and 4, the region 26 also serving as respective source regions of driver MOST's 18B, 19D, 19E, 18E, 18F and 19G of the adjacent cells. The source region 26 is grounded to apply a ground potential to the source of each driver MOST.

It should be noted that, in FIG. 9, impurity introduced regions 21 to 25 and 22' define nodes of the memory cells, and the numerals 27 to 31 denote connecting portions for electrically connecting these nodes and the gate electrode layers of the corresponding driver MOST's.

As is well known, the impurity introduced regions 13 to 16, 21, 22, 22', 23 to 25 and 26 are formed in such a manner that a doping impurity is introduced into predetermined portions of the surface of the semiconductor substrate by ion implantation or diffusion technique using as a mask the gate electrode layers of the transfer gate and driver MOST's or a gate insulator film formed under this electrode layer.

Referring next to FIG. 10, which is a sectional view through a portion of the source region 26 and the gate electrodes 18A and 18B of the arrangement shown in FIG. 9, the reference numeral 55 denotes a semiconductor substrate, 52, 26, 54 impurity introduced regions, 18A, 18B gate electroad layers, 71 an insulator film, 72 another insulator film formed for the purpose of leveling the surface of the semiconductor device, and 113, 114 data lines.

SUMMARY OF THE INVENTION

It has been revealed by the examination made by the present inventors that the SRAM having the layout structure shown in FIG. 9 and the cross-sectional structure shown in FIG. 10 involves the following problems.

(1) The impurity introduced region 26 constitutes respective source regions of a plurality of driver MOST's 3 and 4 and also defines connecting portions for electrically connecting these source regions in common.

On the other hand, this impurity introduced region 26 is formed by introduction of a doping impurity into the semiconductor substrate, and there is an upper limit in the introduceable amount of an impurity. Accordingly, there is a lower limit in the sheet resistance of the impurity introduced region 26.

To write down data into the memory cell, the transfer gate MOST's 1 and 2 are controlled so that they are made conductive, and currents are allowed to flow into the impurity introduced region 26 from the impurity introduced region 26 from the impurity introduced regions 13 to 16 serving as data lines through the transfer gate MOST's and the driver MOST's.

Since the sheet resistance of the impurity introduced region 26 is relatively high as described above, a particularly large voltage drop in the impurity introduced region 26 has an undesirable effect on the operation of the SRAM.

To avoid this problem, it suffices to increase the width of a source mutual connecting region of the impurity introduced region 26 (i.e., a region defined between the gate electrode layers 18A, 19A of the driver MOST's of one memory cell and the gate electrode layers 19E, 18E of the driver MOST's of another memory cell which is adjacent to this memory cell). This, however, leads to an increase in the spacing between the memory cells which are adjacent to each other, resulting disadvantageously in lowering in the integration density.

In order to avoid such lowering in the integration density, the present inventors also examined a multilayer electrode wiring technique such as described below.

(2) An electrode wiring layer which is formed simultaneously with a first-level electrode wiring layer for forming the gate electrode layers of the driver MOST's and those of the transfer gate MOST's is connected to the above-described source mutual connecting region to thereby lower the source mutual resistance.

However, since the simultaneously formed electrode wiring layer serves as a mask for introduction of a doping impurity as described above, it is impossible to form the impurity introduced region 26 directly below this electrode wiring layer. Accordingly, the simultaneously formed electrode wiring layer and the impurity introduced region 26 must be formed in different portions, respectively, on the surface of the semiconductor substrate, which also results in lowering in the integration density.

(3) Respective source regions (impurity introduced regions) of a plurality of driver MOST's are connected in common through a polycrystalline silicon layer which is formed simultaneously with a second-level polycrystalline silicon layer for forming a wiring layer for the power supply potential Vcc and high-resistance loads.

However, the second-level polycrystalline silicon before a doping impurity is introduced therein contains substantially no impurity (so-called non-doped state) in order to form high-resistance loads and is non-silicide pure polycrystalline silicon. Therefore, there is a limit in lowering of the resistance of the second-level polycrystalline silicon after the introduction of a doping impurity, which means that the resistance of the sources of the driver MOST's cannot satisfactorily be lowered.

(4) The source mutual resistance is lowered by bringing aluminum (Al) wiring into contact with the source mutual connecting region of the impurity introduced region 26.

However, since the wiring layer for the power supply potential Vcc which is defined by the second-level polycrystalline silicon is disposed above the source mutual connecting region of the impurity introduced region 26, the contact between the source mutual connecting region of the impurity introduced region 26 and the Al wiring must be made in a portion where the wiring layer for the power supply potential Vcc is not present, which needs to increase the area of the source mutual connecting region, resulting in a low integration density.

The present invention has been accomplished on the basis of the results of examination described above, and it is an object of the present invention to provide a semiconductor memory device so designed that it has a high integration density and the resistance of the sources of two driver MOST's in each of the memory cells is lowered.

The following is a brief summary of a representative one of the embodiments of the present invention.

Namely, the gate electrode layers of driver and transfer gate MOST's in a memory cell are defined by a conductive layer which is a first-level layer provided on the surface of a semiconductor substrate. The source regions of two driver MOST's in the memory cell are connected in common through a conductive layer which is a second-level layer. Two high-resistance loads of the memory cell are defined by a high-resistance material layer which is a third-level layer.

The conductive layer for mutually connecting the source regions of two driver MOST's is formed from a material having a lower resistance than that of the third-level layer.

BRIEF DESCRIPTION OF THE DRAWINGS

FIGS. 7(a) to 7(f) respectively show steps in the process for producing the second embodiment;

in FIG. 9.

DESCRIPTION OF THE PREFERRED EMBODIMENTS

Embodiments of the present invention will be described hereinunder with reference to the accompanying drawings.

Figure 1A:
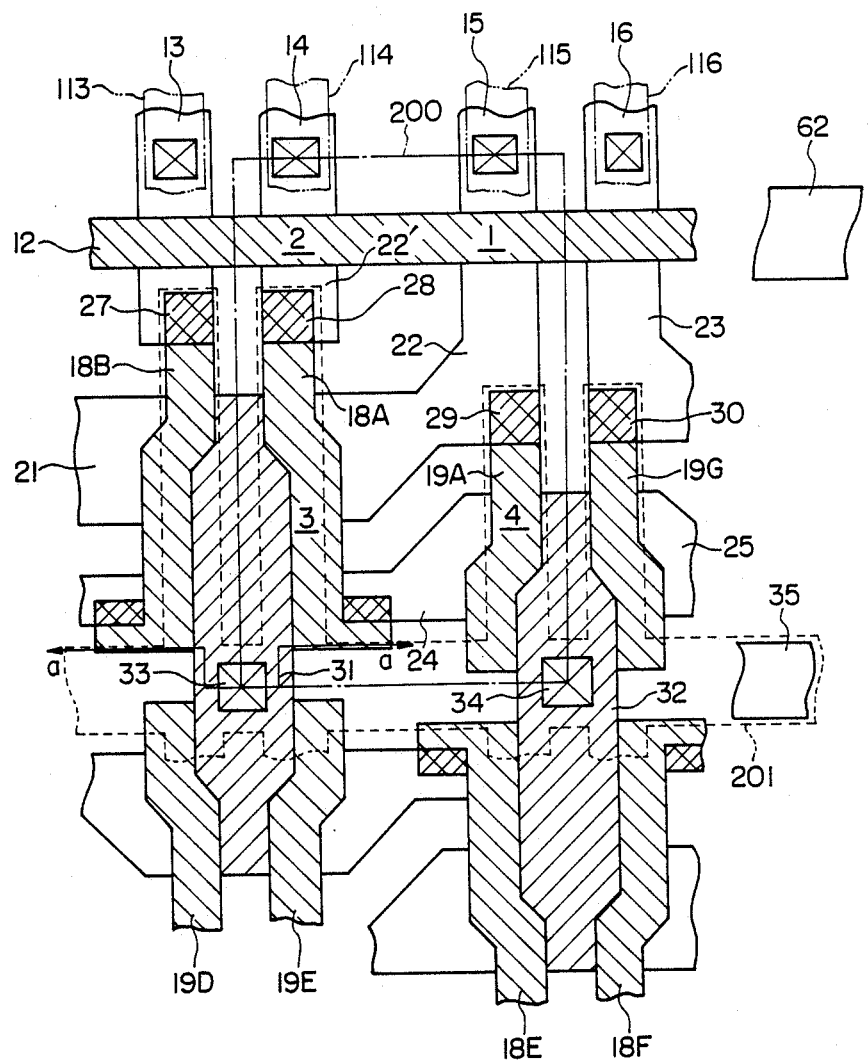
FIGS. 1(A) and 1(B) show in combination the layout of a first embodiment of the present invention.
Figure 1B:
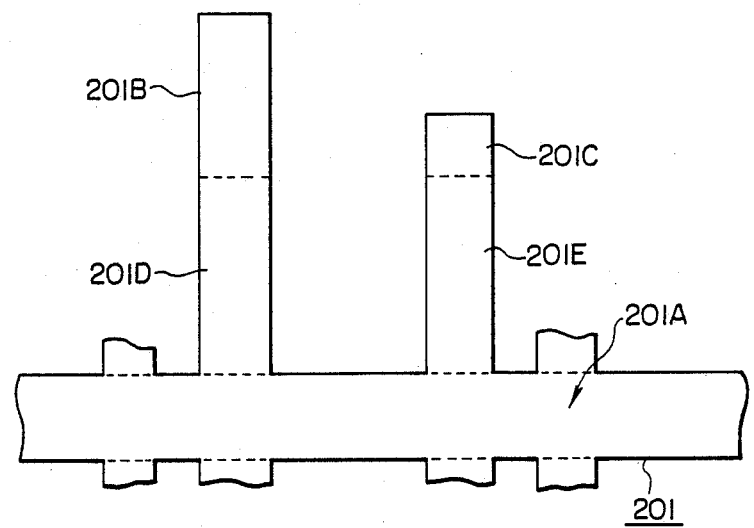
Figure 2:
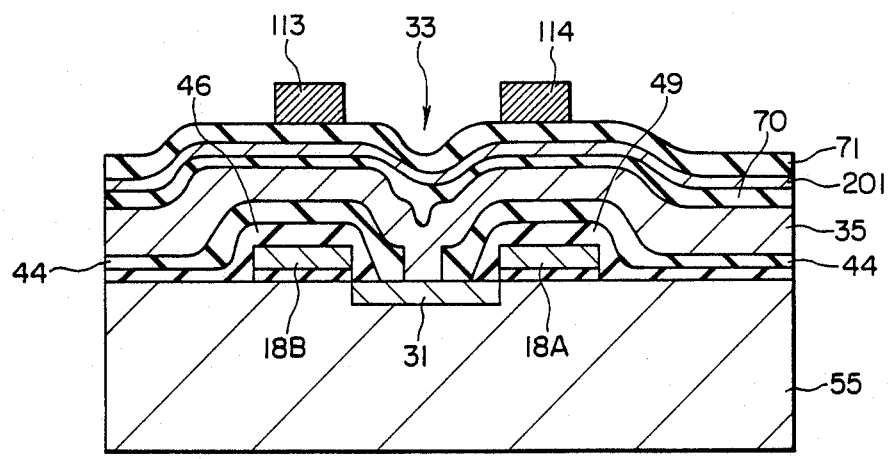
FIG. 2 is a sectional view of SRAM cells taken along line a—a in FIG. 1(A)
Figure 9:
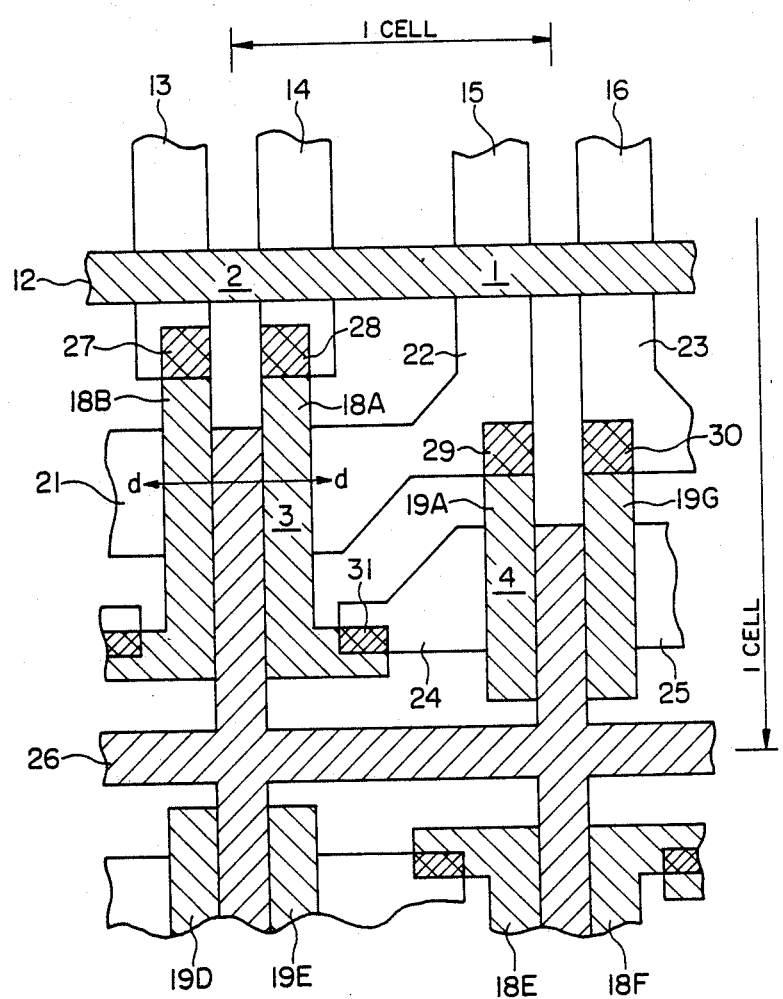
FIG. 9 shows the layout of a SRAM memory cell developed by the present inventors prior to this application.

The layout of a first embodiment is shown in FIGS. 1(A) and 1(B), and a cross-section of the driver transistor 3 of the embodiment is shown in FIG. 2. In this embodiment, source regions and a ground wiring conductive layer are connected through contact holes, and the same elements or portions as those shown in FIG. 9 are denoted by the same reference numerals. In these figures, the reference numeral 31 denotes a MOSTs' common source region for gate electrode layers 18A, 18B, 19D and 19E, and the numeral 32 denotes a MOSTs' common source region for gate electrode layers 19A, 19G, 18E and 18F. These source regions 31 and 32 are connected to a newly provided silicide polycrystalline silicon layer 35 through respective contact holes 33 and 34 and are thus grounded through this layer 35.

A cell region 200 for one memory cell has a square configuration. Transfer gate MOST's 2 and 1 are disposed in the vicinity of the upper side of this square cell region 200. Impurity introduced regions 15, 14, 22 and 22' act as source or drain regions of the transfer gate MOST's 1 and 2. The impurity introduced regions 15 and 14 act as parts of a pair of data lines of the cell 200.

An impurity introduced region 31 which defines the source region of a driver MOST 3 is disposed at the left-hand side of the square cell region 200, and an impurity introduced region 32 which defines the source region of a driver MOST 4 is disposed at the right-hand side of the cell region 200.

The impurity introduced region 22 acts as the drain region of the driver MOST 3 and is connected to the gate electrode layer 19A of the driver MOST 4 through a contact 29.

The impurity introduced region 22' is connected to the gate electrode layer 18A of the driver MOST 3 through a contact 28. The impurity introduced region 24 acts as the drain region of the driver MOST 4 and is connected to the gate electrode layer 18A through a contact.

The gate electrode layers 12, 18A and 19A are defined by a first-level conductive layer provided on the surface of the semiconductor substrate. This conductive layer is formed from a high-melting point material (e.g., polycrystalline silicon having an impurity introduced therein).

The source regions 31 and 32 of the two driver MOST's of the memory cell 200 are connected in common and connected to a ground potential point through a second-level conductive layer 35 which is formed on a SiO$_2$ film 44 through respective contact holes 33 and 34 formed in the film 44 as shown in FIG. 2.

The second-level conductive layer 35 is formed from a low-resistance material (e.g., a refractory metal such as Mo or W, a silicide formed by the reaction of such a refractory metal and polycrystalline silicon, or a two-layer structure consisting of a silicide and polycrystalline silicon). Accordingly, it is possible to lower the resistance of the sources of the driver MOST's 3 and 4.

A conductive layer 62 made of a low-resistance material which is formed simultaneously with the conductive layer 35 is brought into contact with a plurality of portions of the gate electrode layer 12 of the transfer gate MOST's 1 and 2, whereby it is possible to lower the resistance value of the transversely distributed resistance of the word line.

Polycrystalline silicon 201 which defines a third-level conductive layer is formed on the second-level conductive layers 35 and 62 through a SiO$_2$ film 70.

Referring to FIG. 1(B), partial regions 201A, 201B and 201C of the polycrystalline silicon 201 have a relatively large amount of a doping impurity introduced therein, while partial regions 201D and 201E have substantially no doping impurity introduced therein.

Accordingly, the partial region 201A acts as a low-resistance wiring layer for supplying the power supply potential Vcc, while the partial regions 201D and 201E act as high-resistance loads of the memory cell, and the partial regions 201B and 201C act as low-resistance wiring layers which are brought into contact with the contacts 28 and 29, respectively.

Accordingly, the second-level conductive layer 35 for the mutual connection between the sources and the low-resistance wiring region 201A for supplying the power supply potential Vcc (the third-level conductive layer) are disposed at the lower side of the cell region 200.

Further, a fourth conductive layer is formed on the third-level conductive layer 201 through a SiO$_2$ film 71. The fourth conductive layer acts as data lines 113 and 114.

As shown in FIG. 1(A), the data lines 113 to 116, which are formed from Al film, are connected to the impurity introduced regions 13 to 16 through contact holes, respectively.

In this embodiment, the gate electrode layers 18A, 18B, 19D, 19E, 19A, 19G, 18E and 18F are bent at their respective intermediate portions in order to provide the contact holes 33 and 34 in the source regions 31 and 32. According to this embodiment, an impurity introduced region such as the region 26 in the structure shown in FIG. 9 need not be provided between the gate electrode layers 18A, 19A and the gate electrode layers 19E, 18E, and it is therefore possible to minimize the spacing between the gate electrode layers 18A, 19A and 19E, 18E within a range in which the circuit elements can be processed with the required dimensions. Further, the same silicon conductive layer as that employed to form polycrystalline silicon layer 35 can be used to form another wiring in the memory cell, for example, the wiring 62 serving as a main word line, which means that it is advantageously possible to lower the transversely distributed resistance of the word line. It is possible, according to this embodiment, to reduce the memory cell area by more than 10%, advantageously.

Figure 3:
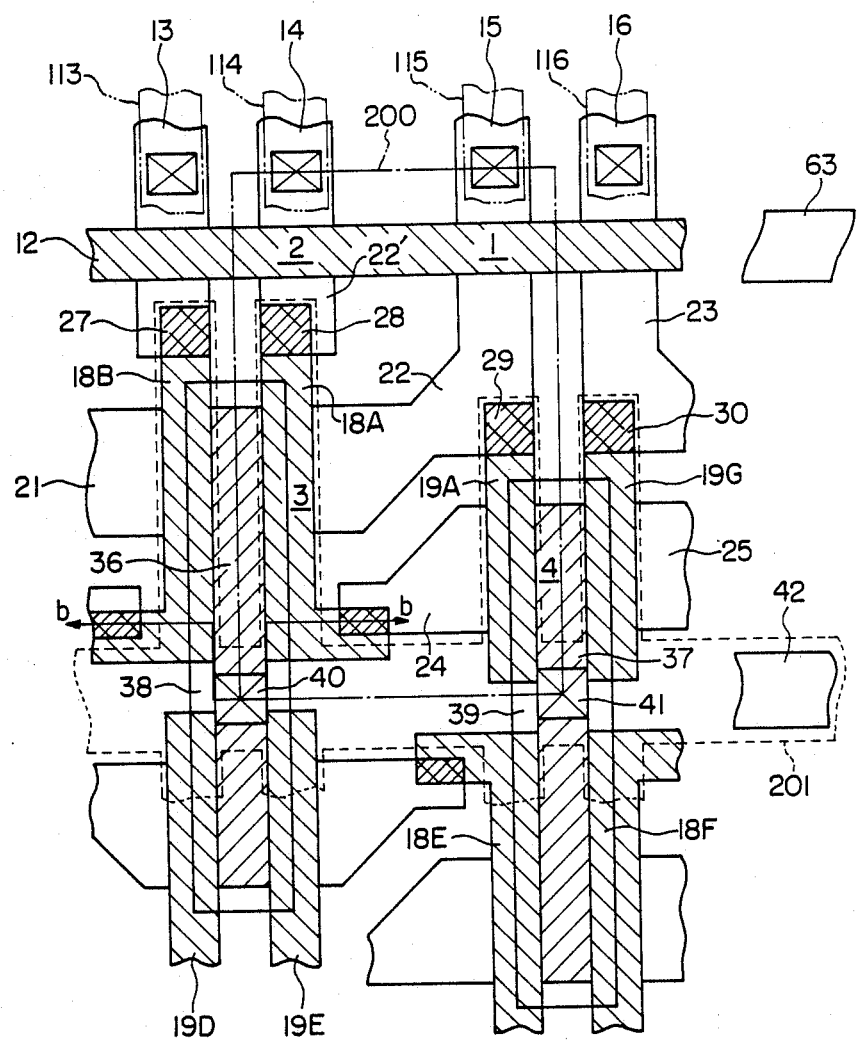
FIG. 3 shows the layout of a second embodiment of the present invention.
Figure 4:
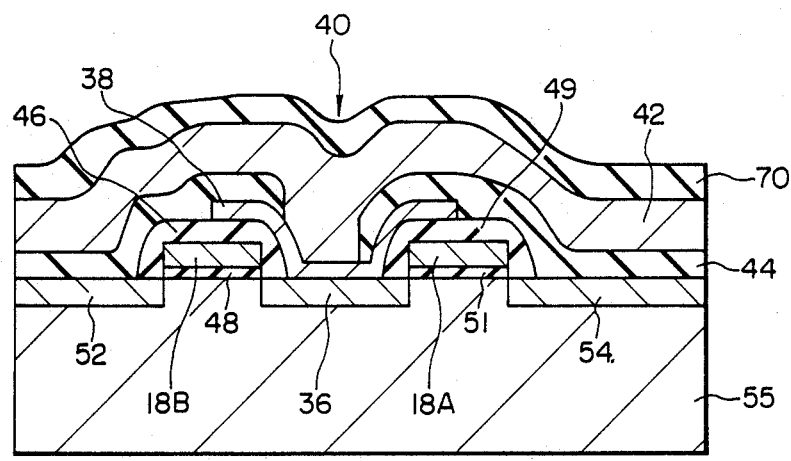
FIG. 4 is a sectional view of SRAM cells taken along line b—b in FIG. 3.

The layout of a second embodiment is shown in FIG. 3, and a cross section of the driver transistor 3 thereof is shown in FIG. 4. In FIG. 3, elements or portions which are similar to those shown in FIG. 1(A) are denoted by the same reference numerals.

In the embodiment shown in FIG. 3, the connection between the source regions of driver MOST's and a ground wiring conductive layer is made by connecting this conductive layer through contact holes to another conductive layer which is formed on the source regions in such a manner that this layer covers a part of each source region and is in electrical contact therewith. In FIGS. 3 and 4, the reference numeral 36 denotes a MOSTs' common source region for gate electrode layers 18A, 18B, 19D and 19E, and the numeral 37 denotes a MOSTs' common source region for gate electrode layers 19A, 19G, 18E and 18F. The numerals 38 and 39 denote polycrystalline silicon layers which are newly provided on the source regions 36 and 37, respectively. In this embodiment, the polycrystalline silicon layers 38 and 39 are connected to an electrode wiring layer 42 through contact holes 40 and 41, respectively, and grounded through this wiring layer 42. In this embodiment also, the region 26 shown in FIG. 9 need not be used, and therefore, the spacing between the gate electrode layers 18A, 19A and the gate electrode layers 19E, 18E can be reduced. Further, unlike the embodiment shown in FIG. 1, this embodiment need not adopt the layout in which the gate electrode layers are bent, which means that it is advantageously possible to employ a layout which is favorable for the characteristics of the MOST's.

In addition, the same layer as the electrode wiring layer 42 serving as a ground wiring can be used as another wiring in the memory cell, for example, a wiring 63 serving as a main word line, advantageously.

It should be noted that the electrode wiring layer 42 and the wiring line 63 serving as a word line are formed from a low-resistance material (e.g., a refractory metal such as Mo or W, a silicide or a two-layer structure consisting of a silicide and polycrystalline silicon).

Referring to FIG. 4, which is a sectional view of the driver transistor 3 of the second embodiment, the gate electrode layers 18A and 18B are covered with insulator layers 46 and 49, respectively. The source region 36 is provided thereon with the polycrystalline silicon layer 38. An insulator film 44 has a contact hole provided in a portion indicated by the reference numeral 40, through which contact hole 40 the polycrystalline layer 38 is connected to the electrode wiring layer 42 so as to be grounded therethrough. According to this embodiment, the provision of the contact hole 40 eliminates the need to provide a margin for providing a contact hole between the gate electrode layers 18A and 18B, which means that the spacing between the gate electrode layers 18A and 18B can be reduced. Accordingly, it is possible to adopt a layout in which the gate electrode layers are disposed close to each other as shown in FIG. 3, and this is effective in reducing the area of the memory cell. It is possible, according to the second embodiment, to reduce the memory cell area by about 20% in total including the 10% reduction enabled by the first embodiment shown in FIGS. 1 and 2.

Figure 6:
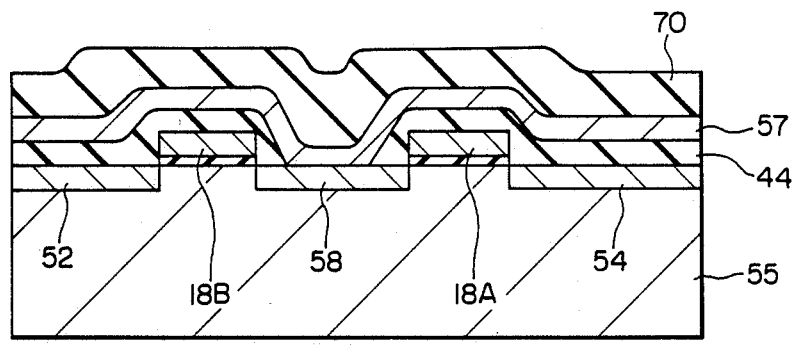
FIG. 6 is a sectional view of SRAM cells taken along line c—c in FIG. 5.
Figure 5:
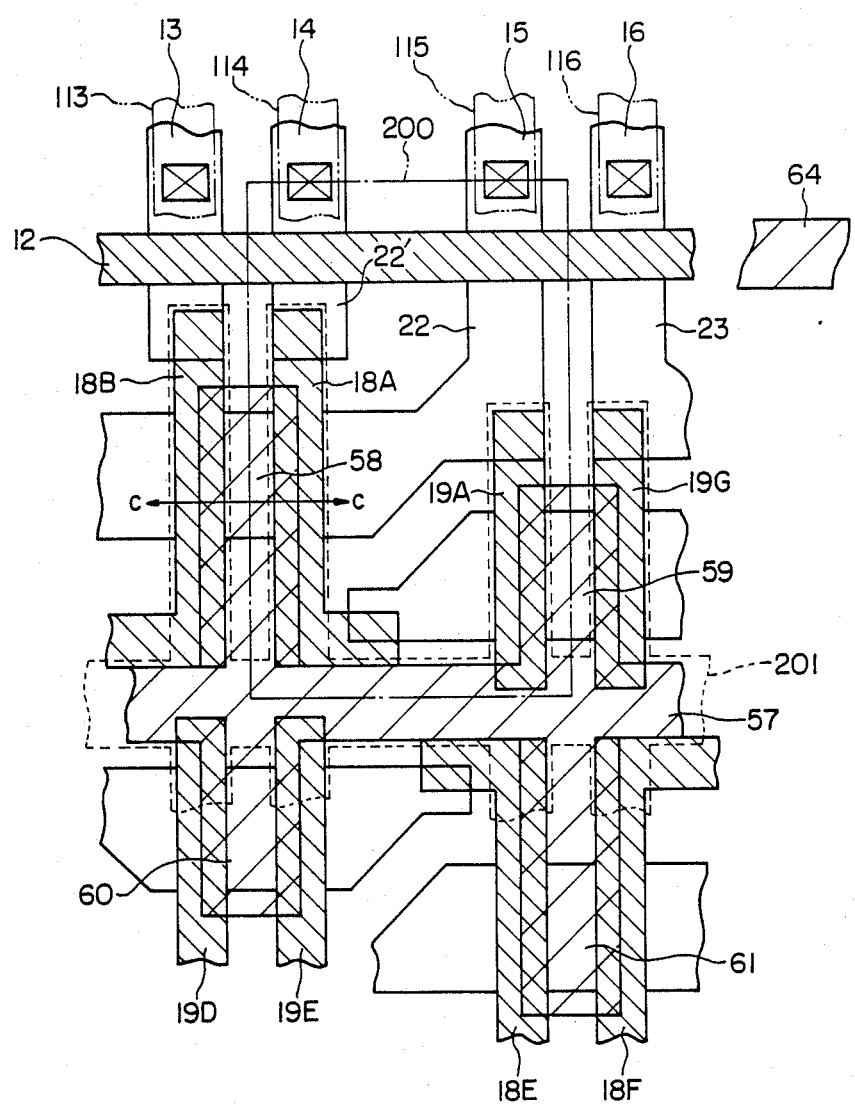
FIG. 5 shows the layout of a third embodiment of the present invention.
Figure 8:
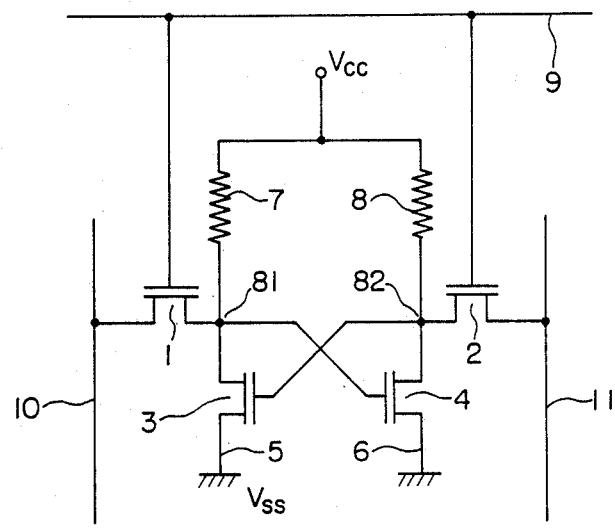
FIG. 8 is a circuit diagram of a known SRAM.
Figure 10:
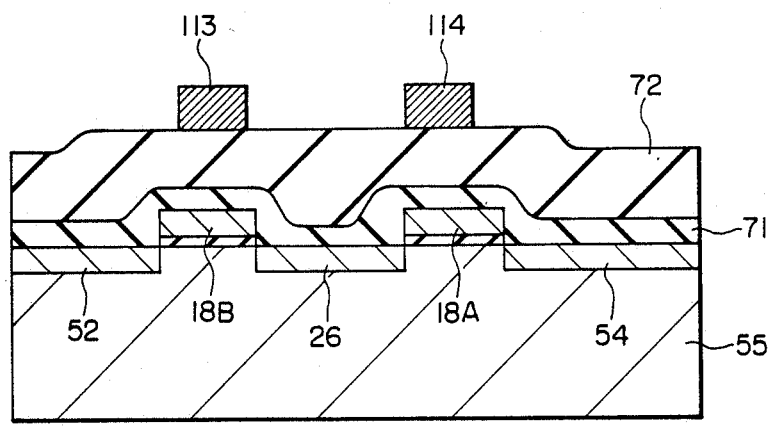
FIG. 10 is a sectional view of SRAM cells taken along line d—d.

The layout of a third embodiment is shown in FIG. 5, and a cross-section of the common source 58 thereof is shown in FIG. 6. In FIGS. 5 and 6, elements or portions similar to those shown in FIGS. 1(A) and 2 are denoted by the same reference numerals.

In the embodiment shown in FIGS. 5 and 6, a conductive layer which is formed on a common source region in such a manner that it covers a part of this source region and is in electrical contact therewith is used as a ground wiring conductive layer. In FIGS. 5 and 6, the reference numerals 58, 59, 60 and 61 denote common source regions for pairs of gate electrode layers 18B, 18A; 19A, 19G; 19D, 19E; and 18E, 18F, respectively. In this embodiment, an electrode wiring layer 57 is stacked over the common source regions 58, 59, 60 and 61 in such a manner that the layer 57 covers a part of each of these common source regions and is in electrical contact therewith, and the electrode wiring layer 57 is thus used as a ground wiring. The advantage of this embodiment resides in that, unlike the first embodiment shown in FIGS. 1(A), 1(B) and 2 or the second embodiment shown in FIGS. 3 and 4, this embodiment uses no contact holes and needs only one polycrystalline silicon layer, and therefore the embodiment structure can be produced in a simplified process.

Further, the same layer as the electrode wiring layer 57 serving as a ground wiring can be employed to provide another wiring in the memory cell, for example, the wiring 64 serving as a main word line.

It should be noted that the electrode wiring layer 57 and the wiring 64 serving as a word line are formed from a low-resistance material (e.g., a refractory metal such as Mo or W, a silicide or a two-layer structure consisting of a silicide and polycrystalline silicon).

The process for producing the memory device according to the present invention will next be described by way of a memory cell in accordance with the second embodiment (shown in FIGS. 3 and 4) as one example and with reference to FIGS. 7(a) to 7(f) which respectively show manufacturing steps in the order according to which the process is carried out. Referring first to FIG. 7(a), the reference numeral 100 denotes a semiconductor substrate. A SiO₂ film 101 is formed on the substrate 100 by thermal oxidation, and a silicon conductive layer 102 and an insulator layer 103 are then formed in that order. Referring next to FIG. 7(b), structures 101a, 102a, 103a; 101b, 102b, 103b; . . . , etc. are formed by selective etching, and with these portions used as a mask, ion implantation is effected to form impurity introduced regions 104a, 104b and 104c. Then, as shown in FIG. 7(c), insulators 105a, 105b, 106a and 106b are formed, and with these insulators used as a mask, ion implantation is carried out to form impurity introduced regions 107, 108 and 109. Referring next to FIG. 7(d), polycrystalline silicon is deposited and then selectively etched to form a conductive layer 110. Then, insulator films 111a and 111b are provided as shown in FIG. 7(e), and a contact hole is provided therein. Finally, as shown in FIG. 7(f), a low-resistance conductive layer −12 is formed to obtain the cell structure in accordance with the second embodiment. Since the memory cell of the second embodiment has a structure in which a contact hole is provided, the distance between the gate electrodes 102a and 102b need not be increased as described above.

According to the present invention, the area of the memory cell can be reduced by about 10%, and the area of the memory chip can be reduced by 5%. If the ground wiring is formed using a silicide layer having a relatively low sheet resistance, the degree to which the voltage is lowered due to currents flowing into the impurity introduced regions from the data line via the transfer gate MOST's and the driver MOST's can be reduced to about 1/10 of that in the case where the impurity introduced regions alone are used.

What is claimed is:
1. A semiconductor memory device comprising:
a plurality of memory cells formed on a principal surface of a semiconductor substrate, where each of said memory cells is defined by a substantially square cell region which has first, second, third and fourth sides, said first and second sides being disposed so as to be in substantially parallel to each other, said third and fourth sides being disposed so as to be in substantially parallel to each other, each of said memory cells including two transfer gate MOS transistors, two driver MOS transistors and two load resistances, said two transfer gate MOS transistors in each of said memory cells being disposed in the vicinity of said first side, said two transfer gate MOS transistors in each of said memory cells having gate electrodes formed from a first electrode wiring layer disposed substantially parallel to said first side, said two driver MOS transistors in each of said memory cells having gate electrodes formed from second and third electrode wiring layers which are formed simultaneously with said first electrode wiring layer, said first, second and third electrode wiring layers being defined by a first-level conductive layer provided on said principal surface of said semiconductor substrate, said two driver MOS transistors in each of said memory cells having source regions respectively disposed in the vicinity of said third side and in the vicinity of said fourth side, each of the source regions of said two driver MOS transistors in each of said memory cells being connected to a fourth conductive layer as a second-level conductive layer formed on said first-level conductive layer, said fourth conductive layer being connected to a first operating potential point, said two load resistance in each of said memory cells being formed from a high-resistance material layer formed as a third-level layer on said second-level conductive layer, said two load resistances in each of said memory cells each having one end thereof connected to said gate electrode of the corresponding one of said two driver MOS transistors, and the other ends of said two load resistances being connected to a second operating potential point which is different from said first operating potential point.

2. A semiconductor memory device according to claim 1, wherein said gate electrodes of said two driver MOS transistors in each of said memory cells are respectively disposed in the vicinity of said third side and in the vicinity of said fourth side.

3. A semiconductor memory device according to claim 2, wherein said first electrode wiring layer is connected to a fifth electrode wiring layer which is said second-level conductive layer which is formed simultaneously with said fourth conductive layer.

4. A semiconductor memory device according to claim 2, wherein said two load resistances are respectively formed on said gate electrodes of said two driver MOS transistors in each of said memory cells.

5. A semiconductor memory device according to claim 4, wherein said high-resistance material layer is formed from polycrystalline silicon having substantially no doping impurity introduced therein, and said other or second ends of said two load resistances are connected to said second operating potential point through a means which is formed from polycrystalline silicon which is deposited simultaneously with said polycrystalline silicon and which has a relatively large amount of a doping impurity introduced therein.

6. A semiconductor memory device according to claim 5, wherein said means is disposed in the vicinity of said second side of said cell region.

7. A semiconductor memory device according to claim 1, further comprising:
  another conductive layer disposed between each of said source regions of said two driver MOS transistors and said fourth conductive layer.

* * * * *